US012530993B2

(12) United States Patent
Lin et al.

(10) Patent No.: US 12,530,993 B2
(45) Date of Patent: Jan. 20, 2026

(54) LED DISPLAY MODULE AND LED DISPLAY DEVICE

(71) Applicant: HCP TECHNOLOGY CO., LTD, Dongguan (CN)

(72) Inventors: Ziqin Lin, Dongguan (CN); Wenrong Zhuang, Dongguan (CN); Ming Sun, Dongguan (CN); Jingquan Lu, Dongguan (CN)

(73) Assignee: HCP TECHNOLOGY CO., LTD, Dongguan (CN)

( * ) Notice: Subject to any disclaimer, the term of this patent is extended or adjusted under 35 U.S.C. 154(b) by 412 days.

(21) Appl. No.: 18/015,427

(22) PCT Filed: Aug. 20, 2020

(86) PCT No.: PCT/CN2020/110333
§ 371 (c)(1),
(2) Date: Jan. 10, 2023

(87) PCT Pub. No.: WO2022/016645
PCT Pub. Date: Jan. 27, 2022

(65) Prior Publication Data

US 2023/0238363 A1 Jul. 27, 2023

(30) Foreign Application Priority Data

Jul. 22, 2020 (CN) ......................... 202010713331.5

(51) Int. Cl.
*G09F 9/33* (2006.01)
*H01L 25/075* (2006.01)

(52) U.S. Cl.
CPC ............ *G09F 9/33* (2013.01); *H01L 25/0753* (2013.01)

(58) Field of Classification Search
CPC ............. G09G 2300/0452; G09G 3/32; H10K 59/353; G09F 9/302; G09F 9/33; H01L 25/0753
See application file for complete search history.

(56) References Cited

U.S. PATENT DOCUMENTS

2007/0046689 A1* 3/2007 Tokimoto ................ G09G 3/32 345/589
2009/0219225 A1 9/2009 Cope
(Continued)

FOREIGN PATENT DOCUMENTS

CN 104037203 A 9/2014
CN 105044954 A 11/2015
(Continued)

OTHER PUBLICATIONS

Translated International Search Report and Written Opinion, Application No. PCT/CN2020/110333, Mailing date of Search Report, May 8, 2021.pp. 1-6.
(Continued)

*Primary Examiner* — Mamadou L Diallo
(74) *Attorney, Agent, or Firm* — CM Law; Stephen J. Weed

(57) ABSTRACT

A LED display module includes multiple pixel rows. A first pixel row includes a plurality of first pixel units. Each of the plurality of first pixel units includes a first sub-pixel, a second sub-pixel, and a third sub-pixel. Sub-pixels of the plurality of first pixel units form at least one first sub-pixel row. A first row of the at least one first sub-pixel row includes at least two types of the first sub-pixel, the second sub-pixel, and the third sub-pixel. A last pixel row includes multiple second pixel units. Each of the plurality of second pixel units includes a first sub-pixel, a second sub-pixel, and a third sub-pixel. Sub-pixels of the plurality of second pixel units form at least one second sub-pixel row. A last row of
(Continued)

the at least one second sub-pixel row includes at least two types of the first sub-pixel, the second sub-pixel, and the third sub-pixel.

8 Claims, 7 Drawing Sheets

(56) References Cited

U.S. PATENT DOCUMENTS

| | | | | |
|---|---|---|---|---|
| 2014/0320518 | A1* | 10/2014 | Morishita | G09G 3/20 345/589 |
| 2016/0043147 | A1 | 2/2016 | Moon | |
| 2017/0004751 | A1* | 1/2017 | Seo | G09G 3/3233 |
| 2019/0319079 | A1* | 10/2019 | Xing | H10K 59/351 |
| 2021/0359034 | A1* | 11/2021 | Shi | H10K 59/353 |
| 2022/0225481 | A1* | 7/2022 | Jung | H05B 45/24 |
| 2022/0301489 | A1* | 9/2022 | Wang | G09G 3/32 |
| 2022/0302093 | A1* | 9/2022 | Gu | H01L 25/167 |
| 2023/0064639 | A1* | 3/2023 | Zhong | H01L 25/167 |
| 2023/0132145 | A1* | 4/2023 | Sun | G09G 3/3225 257/40 |
| 2023/0343812 | A1* | 10/2023 | Zhang | H10K 59/353 |

FOREIGN PATENT DOCUMENTS

| | | | | | |
|---|---|---|---|---|---|
| CN | 107994048 | A | | 5/2018 | |
| CN | 109036257 | A | * | 12/2018 | G09G 3/2003 |
| CN | 109285502 | A | | 1/2019 | |
| CN | 110767707 | A | | 2/2020 | |
| CN | 111279486 | A | | 6/2020 | |
| CN | 210777624 | U | * | 6/2020 | |
| CN | 212659257 | U | | 3/2021 | |
| KR | 20170116598 | A | | 10/2017 | |
| WO | 2012157536 | A1 | | 11/2012 | |

OTHER PUBLICATIONS

Search Report received in European Application No. 20945814.0-1207 dated Apr. 29, 2024, 9 pages.

1st Chinese Office Action for Chinese Application No. 202010713331.5, dated Jun. 12, 2024 (Jun. 12, 2024)—8 pages (English translation—8 pages).

* cited by examiner

LED DISPLAY MODULE AND LED DISPLAY DEVICE

CROSS-REFERENCE TO RELATED APPLICATION(S)

This is a national stage application filed under 37 U.S.C. 371 based on International Patent Application No. PCT/CN2020/110333, filed Aug. 20, 2020, which claims priority to Chinese Patent Application No. 202010713331.5 filed with the China National Intellectual Property Administration (CNIPA) on Jul. 22, 2020, the disclosure of which is incorporated herein by reference in its entirety.

TECHNICAL FIELD

The present disclosure relates to the field of display technologies, for example, a light-emitting diode (LED) display module and an LED display device.

BACKGROUND

As a society constantly develops, the LED industry becomes one of the most active industries, and LED display products gradually come into many fields of society and life. Meanwhile, with the innovation and development of LED display technologies, fine-pitch LED display modules having a high resolution per unit area have become a mainstream product of an LED display. The fine-pitch LED display modules can display higher-definition graphics, images, and videos, can also display much more videos and images, and can achieve any large area splicing, especially in the application of image splicing.

Typically, an LED display device is formed by splicing a plurality of LED display modules. Each of the plurality of LED display modules includes a plurality of pixels arranged in an array, each of the plurality of pixels consists of three LED chips (each of the three LED chips is referred to as a sub-pixel). However, in the related art, splicing seams inevitably exist when the plurality of LED display modules are spliced, and light is prone to transmit through the splicing seams. In LED sub-pixels of two rows or columns adjacent to the splicing seams, all sub-pixels in one row are of the same color, and all sub-pixels in the other row are of the same color (alternatively, all sub-pixels in one column are of the same color, and all sub-pixels in the other column are of the same color), directly causing problem that the color lines of yellow/cyan/pink appear at the splicing seams, thereby affecting the display effect of the LED display device.

SUMMARY

The present disclosure provides an LED display module and an LED display device to ameliorate the problem that color lines appear at splicing seams after LED display modules are spliced.

Embodiments of the present disclosure provide a LED display module including a plurality of pixel rows. A first pixel row includes a plurality of first pixel units arranged sequentially in a row direction. Each of the plurality of first pixel units includes a first sub-pixel, a second sub-pixel, and a third sub-pixel. Sub-pixels of the plurality of first pixel units form at least one first sub-pixel row arranged in the row direction. A first row in the at least one first sub-pixel row includes at least two types of the first sub-pixel, the second sub-pixel, and the third sub-pixel.

A last pixel row includes multiple second pixel units arranged sequentially in the row direction. Each of the plurality of second pixel units includes a first sub-pixel, a second sub-pixel, and a third sub-pixel. Sub-pixels of the plurality of second pixel units form at least one second sub-pixel row arranged in the row direction. A last row in the at least one second sub-pixel row includes at least two types of the first sub-pixel, the second sub-pixel, and the third sub-pixel.

An embodiment of the present disclosure also provides a LED display device including multiple LED display modules arranged in an array.

DETAILED DESCRIPTION

Figure 1:
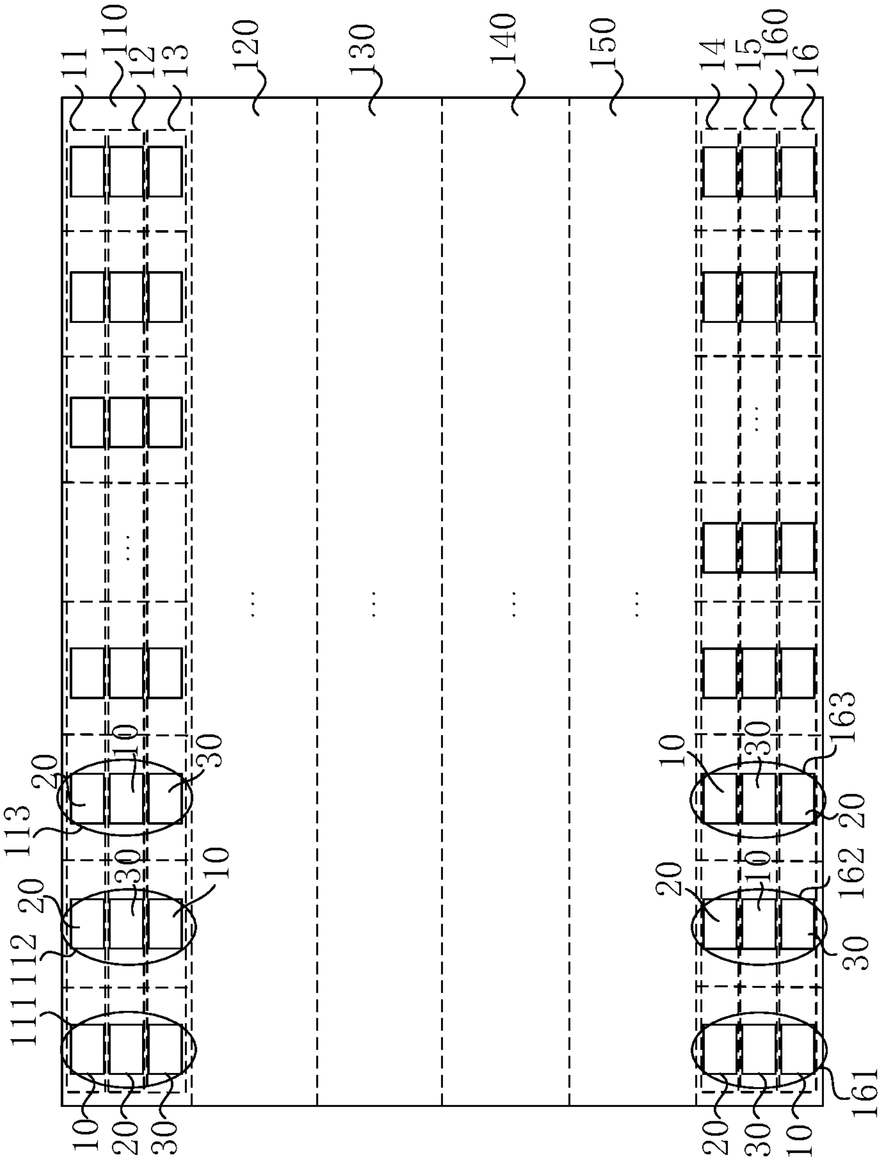
FIG. 1 is a structure illustration of an LED display module according to embodiment one of the present disclosure.

The present disclosure is described below in conjunction with drawings and embodiments. The embodiments described herein are merely intended to explain and not to limit the present disclosure. For ease of description, only part, not all, of structures related to the present disclosure are illustrated in the drawings.

Embodiment One

FIG. 1 is a structure illustration of an LED display module according to embodiment one of the present disclosure. Referring to FIG. 1, the LED display module includes multiple pixel rows, such as a first pixel row 110, a second pixel row 120, a third pixel row 130, a fourth pixel row 140, a fifth-pixel row 150 . . . and a last pixel row 160 in FIG. 1.

The first pixel row 110 includes a plurality of first pixel units arranged sequentially in a row direction, such as a first first pixel unit 111, a second first pixel unit 112, and a third first pixel unit 113 . . . in FIG. 1. Each of the plurality of first pixel units includes a first sub-pixel 10, a second sub-pixel 20, and a third sub-pixel 30. Sub-pixels in all of the first pixel units form at least one first sub-pixel row arranged in the row direction. For example, the sub-pixels in all of the first pixel units in FIG. 1 form three first sub-pixel rows arranged in the row direction, namely, a first first sub-pixel row 11, a second first sub-pixel row 12, and a third first sub-pixel row 13. A first row in the at least one first sub-pixel row includes at least two types of the first sub-pixel, the second sub-pixel, and the third sub-pixel. For example, the first first sub-pixel row 11 in FIG. 1 includes the first sub-pixel 10 and second sub-pixels 20. The last pixel row includes multiple second pixel units arranged sequentially in the row direction, such as a first second pixel unit 161, a second second pixel unit 162, and a third second pixel unit 163 . . . in FIG. 1. Each of the plurality of second pixel unit includes a first sub-pixel 10, a second sub-pixel 20, and a third sub-pixel 30. Sub-pixels in all of the second pixel units form at least one second sub-pixel row arranged in the row direction. For example, the sub-pixels in all of the second pixel units in FIG. 1 form three second sub-pixel rows arranged in the row direction, namely, a first second sub-pixel row 14, a second second sub-pixel row 15, and a third second sub-pixel row 16. A last row in the at least one second sub-pixel row includes at least two types of the first sub-pixel, the second sub-pixel, and the third sub-pixel. For example, the third second sub-pixel row 16 in FIG. 1 includes the first sub-pixel 10 and the second sub-pixel 20.

The number of first sub-pixel rows may be one, two, or three. The number of second sub-pixel rows may be one, two, or three. The number of first sub-pixel rows is related to the arrangement of the first sub-pixel, the second sub-pixel, and the third sub-pixel in each first pixel unit. The number of second sub-pixel rows is related to the arrangement of the first sub-pixel, the second sub-pixel, and the third sub-pixel in each second pixel unit. In this embodiment, FIG. 1 only exemplarily shows one case, and in the one case the number of rows is related to the actual arrangement of the sub-pixels in the first pixel unit and the sub-pixels in the second pixel unit, and is not limited herein.

Referring to FIG. 1, the first first sub-pixel row 11 of the first pixel row 110 includes at least two types of the first sub-pixel 10, the second sub-pixel 20, and the third sub-pixel 30. The third second sub-pixel row 16 of the last pixel row 160 includes at least two types of the first sub-pixel 10, the second sub-pixel 20, and the third sub-pixel 30. In this manner, the light emitted from pixels on the edge of the first pixel row 110 of the LED display module is derived from the sub-pixels of at least two colors, such as at least two combinations of the first sub-pixel 10, the second sub-pixel 20, and the third sub-pixel 30. Similarly, the light emitted from pixels on the edge of the last pixel row 160 of the LED display module is also derived from the sub-pixels of at least two colors. Therefore, when multiple LED display modules are spliced, at the splices, it can be guaranteed that light emitted from the LED pixels is from the sub-pixels of at least two colors among the three colors, thereby ameliorating the problem that the color lines of yellow light, cyan light, or pink light appear at the splicing seams. When two types of the first sub-pixel, the second sub-pixel, and the third sub-pixel included in the first row in the at least one first sub-pixel row in the first pixel row of the LED display module, and two types of the first sub-pixel, the second sub-pixel, and the third sub-pixel included in the last row in the at least one second sub-pixel row in the last pixel row of the LED display module are different sub-pixel combinations, the problem that the color lines of yellow light, cyan light, or pink light appear at the splicing seams can be better ameliorated.

In addition, when the first row in the at least one first sub-pixel row in the first pixel row of the LED display module includes three types of the first sub-pixel, the second sub-pixel, and the third sub-pixel, and/or when the last row in the at least one second sub-pixel row in the last pixel row of the LED display module includes three types of the first sub-pixel, the second sub-pixel, and the third sub-pixel, the problem that color lines of yellow light, cyan light, or pink light appear at the splicing seams can also be better ameliorated.

In the technical solutions of this embodiment, the first row in the at least one first sub-pixel row in the first pixel row of the LED display module includes at least two types of the first sub-pixel, the second sub-pixel, and the third sub-pixel, and the last row in the at least one second sub-pixel row in the last pixel row includes at least two types of the first sub-pixel, the second sub-pixel, and the third sub-pixel. In this manner, the light emitted from the LED pixels on the edge of the first pixel row, and the light emitted from the LED pixels on the edge of the last pixel row of the LED display module are both from at least two types of the first sub-pixel, the second sub-pixel, and the third sub-pixel, ensuring that the light emitted from the LED pixels at each edge is not derived from the sub-pixels of a single color, thereby ameliorating the problem that color lines appear at the splicing seams after the LED display modules are spliced.

Embodiment Two

Figure 2:
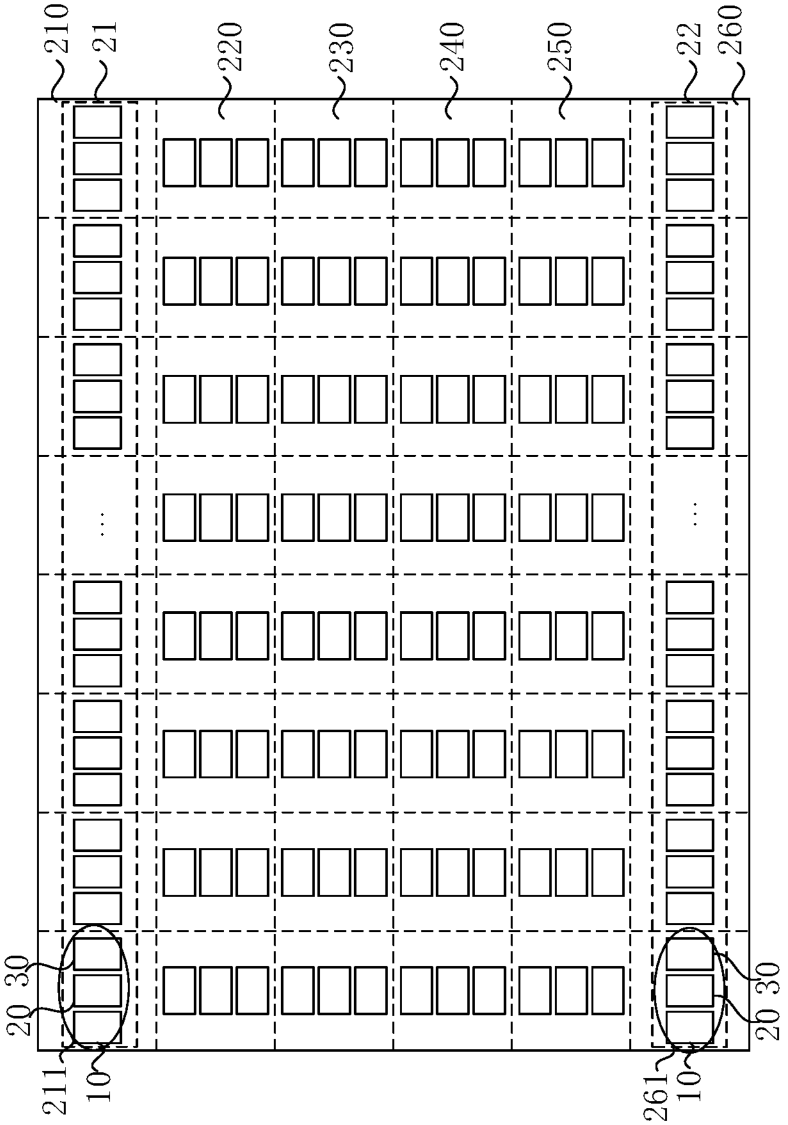
FIG. 2 is a structure illustration of an LED display module according to embodiment two of the present disclosure.
Figure 3:
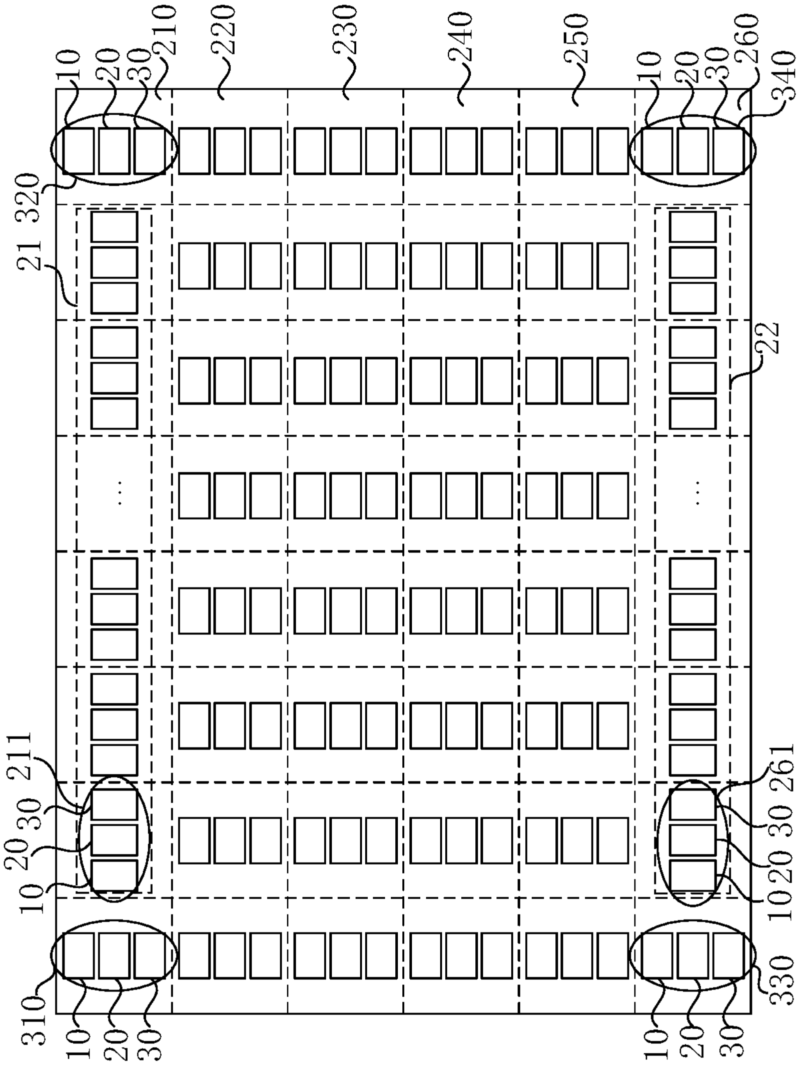
FIG. 3 is a structure illustration of another LED display module according to embodiment two of the present disclosure.

FIG. 2 is a structure illustration of an LED display module according to embodiment two of the present disclosure. FIG. 3 is a structure illustration of another LED display module according to embodiment two of the present disclosure. On the basis of the preceding embodiment, the each of the plurality of first pixel units includes the first sub-pixel, the second sub-pixel, and the third sub-pixel arranged in the row direction. The sub-pixels of all of the first pixel units form one first sub-pixel row arranged in the row direction. The each of the plurality of second pixel units includes the first sub-pixel, the second sub-pixel, and the third sub-pixel arranged in the row direction. The sub-pixels of all of the second pixel units form one second sub-pixel row arranged in the row direction.

Referring to FIG. 2, the LED display module includes a first pixel row 210, a second pixel row 220, a third pixel row 230, a fourth pixel row 240, a fifth pixel row 250 . . . and a last pixel row 260. The first pixel row 210 includes a plurality of first pixel units 211 arranged sequentially in the row direction. Each of the plurality of first pixel units 211 includes the first sub-pixel 10, the second sub-pixel 20, and the third sub-pixel 30 arranged in the row direction. The sub-pixels of the plurality of first pixel units 211 form one first sub-pixel row 21 arranged in the row direction. The last pixel row 260 includes multiple second pixel units 261 arranged sequentially in the row direction. Each of the plurality of second pixel units 261 includes the first sub-pixel 10, the second sub-pixel 20, and the third sub-pixel 30 arranged in the row direction. The sub-pixels of the plurality of second pixel units 261 form one second sub-pixel row 22 arranged in the row direction.

Referring to FIG. 2, the first sub-pixel row 21 in the first pixel row 210 of the LED display module includes the first sub-pixel 10, the second sub-pixel 20, and the third sub-pixel 30, and the second sub-pixel row 22 in the last pixel row 260 of the LED display module also includes the first sub-pixel 10, the second sub-pixel 20, and the third sub-pixel 30. In this manner, the light emitted from pixels on the edge of the first sub-pixel row 210 of the LED display module is derived from the sub-pixels of three colors, namely, the first sub-pixel 10, the second sub-pixel 20, and the third sub-pixel 30. The light emitted from pixels on the edge of the last pixel row 260 of the LED display module is also derived from the sub-pixels of three colors, namely, the first sub-pixel 10, the second sub-pixel 20, and the third sub-pixel 30. Therefore, when multiple LED display modules are spliced, at the splices, it can be guaranteed that light emitted from the LED pixels at each edge is from the sub-pixels of three colors, thereby ameliorating the problem that color lines of yellow light, cyan light, or pink light that appear at the splicing seams.

Optionally, the first pixel row and/or the last pixel row also includes third pixel units. The third pixel units are respectively located at two ends of the first pixel row and/or the last pixel row. Each of the third pixel units includes a first sub-pixel, a second sub-pixel, and a third sub-pixel. The first sub-pixel, the second sub-pixel, and the third sub-pixel are arranged in a column direction.

Referring to FIG. 3, the first pixel row 210 includes a first third pixel unit 310 and a second third pixel unit 320. The first third pixel unit 310 is located at one end of the first pixel row 210. The second third pixel unit 320 is located at the other end of the first pixel row 210. The first third pixel unit 310 and the second third pixel unit 320 each include the first sub-pixel 10, the second sub-pixel 20, and the third sub-pixel 30. The first sub-pixel 10, the second sub-pixel 20, and the third sub-pixel 30 are arranged in the column direction.

The last pixel row 260 includes a third third pixel unit 330 and a fourth third pixel unit 340. The third third pixel unit 330 is located at one end of the last pixel row 260. The fourth third pixel unit 340 is located at the other end of the last pixel row 260. The third third pixel unit 330 and the fourth third pixel unit 340 each include the first sub-pixel 10, the second sub-pixel 20, and the third sub-pixel 30. The first sub-pixel 10, the second sub-pixel 20, and the third sub-pixel 30 are arranged in the column direction.

Referring to FIG. 3, the first third pixel unit 310, the first sub-pixel row 21, and the second third pixel unit 320 constitute the first pixel row 210 of the LED display module, and the third third pixel unit 330, the second sub-pixel row 22, and the fourth third pixel unit 340 constitute the last pixel row 260 of the LED display module. In this manner, the light emitted from pixels on the edge of the first sub-pixel row 210 of the LED display module is derived from the sub-pixels of three colors, namely, the first sub-pixel 10, the second sub-pixel 20, and the third sub-pixel 30. The light emitted from pixels on the edge of the last pixel row 260 of the LED display module is also derived from the sub-pixels of three colors, namely, the first sub-pixel 10, the second sub-pixel 20, and the third sub-pixel 30. Therefore, when multiple LED display modules are spliced, at the splices, it can be guaranteed that light emitted from the LED pixels at each edge is from the sub-pixels of three colors, thereby ameliorating the problem that color lines of yellow light, cyan light, or pink light appear at the splicing seams.

Embodiment Three

Figure 4:
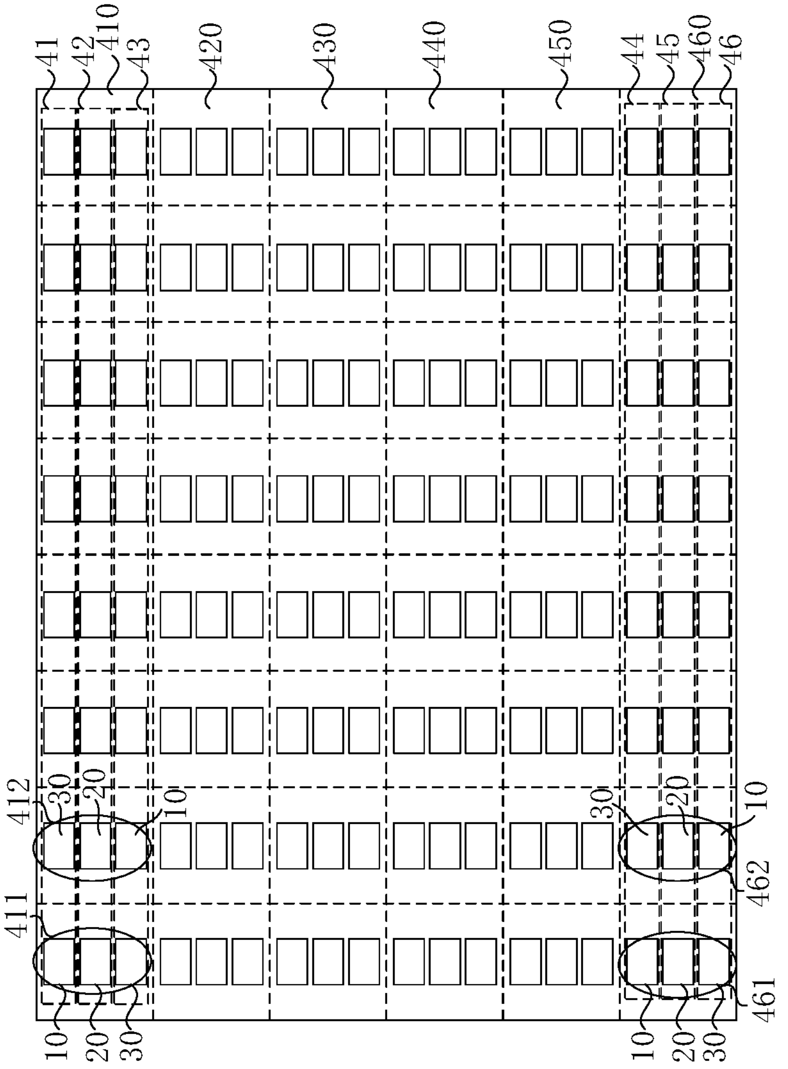
FIG. 4 is a structure illustration of an LED display module according to embodiment three of the present disclosure.
Figure 5:
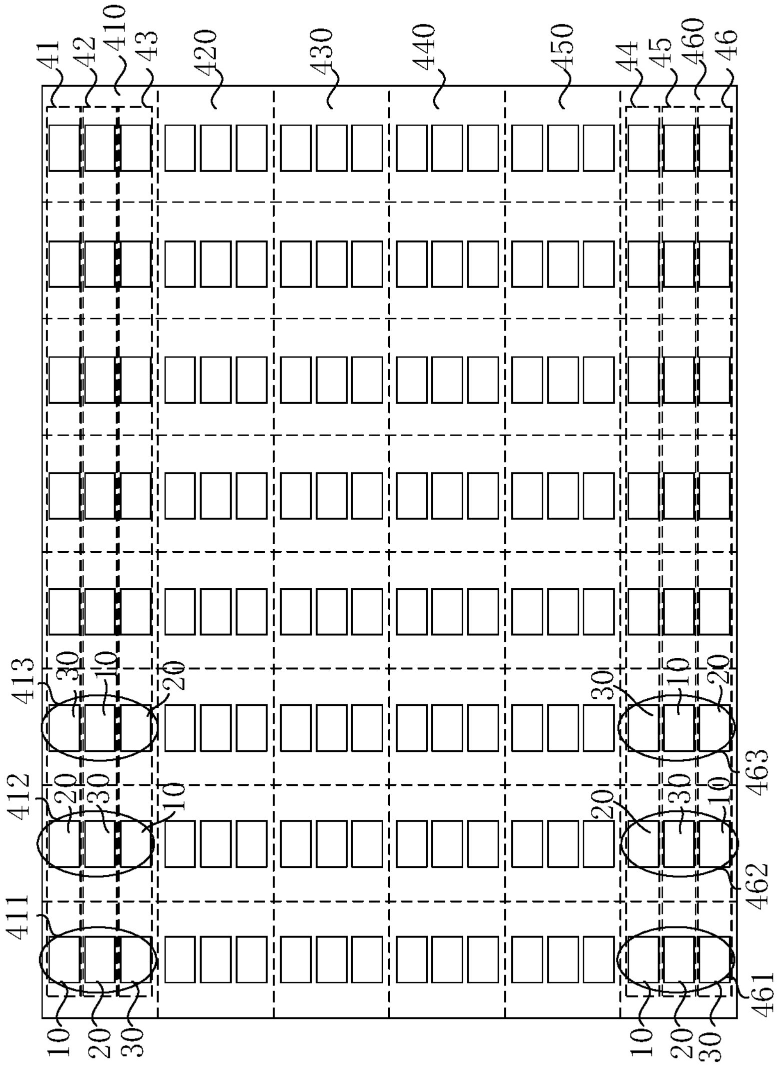
FIG. 5 is a structure illustration of another LED display module according to embodiment three of the present disclosure.

FIG. 4 is a structure illustration of an LED display module according to embodiment three of the present disclosure. FIG. 5 is a structure illustration of another LED display module according to embodiment three of the present disclosure. On the basis of the preceding embodiments, the each of the plurality of first pixel units includes the first sub-pixel, the second sub-pixel, and the third sub-pixel arranged in the column direction. The sub-pixels of all of the first pixel units form a plurality of first sub-pixel rows arranged in the row direction. A first row of the plurality of first sub-pixel rows includes at least two types of the first sub-pixel, the second sub-pixel, and the third sub-pixel. The each of the plurality of second pixel units includes the first sub-pixel, the second sub-pixel, and the third sub-pixel arranged in the column direction. The sub-pixels of all of the second pixel units form multiple second sub-pixel rows arranged in the row direction. A last row of the plurality of second sub-pixel rows includes at least two types of the first sub-pixel, the second sub-pixel, and the third sub-pixel.

Referring to FIG. 4, the LED display module includes a first pixel row 410, a second pixel row 420, a third pixel row 430, a fourth pixel row 440, a fifth pixel row 450, and a last pixel row 460. The first pixel row 410 includes a plurality of first pixel units, such as a first first pixel unit 411 and a second first pixel unit 412, that are arranged sequentially in the row direction. The first first pixel unit 411 includes the first sub-pixel 10, the second sub-pixel 20, and the third sub-pixel 30 arranged in the column direction. The second first pixel unit 412 includes the third sub-pixel 30, the second sub-pixel 20, and the first sub-pixel 10 arranged in the column direction. The sub-pixels of the first first pixel unit 411, the second first pixel unit 412, and other first pixel units form a first first sub-pixel row 41, a second first sub-pixel row 42, and a third first sub-pixel row 43 arranged in the row direction. The first first sub-pixel row 41 of the preceding plurality of first sub-pixel rows includes at least two types of the first sub-pixel 10, the second sub-pixel 20, and the third sub-pixel 30.

The last pixel row 460 includes multiple second pixel units such as a first second pixel unit 461 and a second second pixel unit 462, that are arranged sequentially in the row direction. The first second pixel unit 461 includes the first sub-pixel 10, the second sub-pixel 20, and the third sub-pixel 30 arranged in the column direction. The second second pixel unit 462 includes the third sub-pixel 30, the second sub-pixel 20, and the first sub-pixel 10 arranged in the column direction. The sub-pixels of the first second pixel unit 461, the second second pixel unit 462, and other second pixel units form a first second sub-pixel row 44, a second second sub-pixel row 45, and a third second sub-pixel row 46 arranged in the row direction. The third second sub-pixel row 46 of the preceding multiple second sub-pixel rows includes at least two types of the first sub-pixel 10, the second sub-pixel 20, and the third sub-pixel 30.

Referring to FIG. 4, a first row in at least one first sub-pixel row in the first pixel row 410, namely, the first first sub-pixel row 41 includes at least two types of the first sub-pixel 10, the second sub-pixel 20, and the third sub-pixel 30, and a last row in at least one second sub-pixel row in the last pixel row 460, namely, the third second sub-pixel row 46 includes at least two types of the first sub-pixel 10, the second sub-pixel 20, and the third sub-pixel 30. In this manner, the light emitted from pixels on the edge of the first pixel row 410 of the LED display module is derived from the sub-pixels of at least two colors, such as a combination of at least two types of the first sub-pixel 10, the second sub-pixel 20, and the third sub-pixel 30. Similarly, the light emitted from pixels on the edge of the last pixel row 460 of the LED display module is also derived from the sub-pixels of at least two colors. Therefore, when multiple LED display modules are spliced, at the splices, it can be guaranteed that light emitted from the LED pixels at each edge is from the sub-pixels of at least two colors among the three colors, thereby ameliorating the problem that color lines of yellow light, cyan light, or pink light appear at the splicing seams.

Optionally, adjacent ones of sub-pixels in the first row of the plurality of first sub-pixel rows emit light of different colors, and adjacent ones of sub-pixels in the last row of the plurality of second sub-pixel rows emit light of different colors. With such an arrangement, at least two different types of sub-pixels on the whole edge of the LED display module are alternately arranged so that the light emitted from the whole edge is a mixture of light emitted from the at least two different types of sub-pixels, preventing the problem as follows: a single type of sub-pixels are at one place on the edge so that color lines of yellow light, cyan light, or pink light appear at the splicing seams. Exemplarily, referring to FIG. 4, the first sub-pixel 10 and the third sub-pixels 30 are alternately arranged in the first first sub-pixel row 41. The third sub-pixel 30 and the first sub-pixel 10 are alternately arranged in the third second sub-pixel row 46.

Optionally, the each of the plurality of first pixel units includes the first sub-pixel, the second sub-pixel, and the third sub-pixel arranged in the column direction. The sub-pixels of all of the first pixel units form a plurality of first sub-pixel rows arranged in the row direction. A first row of the plurality of first sub-pixel rows includes the first sub-pixel, the second sub-pixel, and the third sub-pixel. The each of the plurality of second pixel units includes the first sub-pixel, the second sub-pixel, and the third sub-pixel arranged in the column direction. The sub-pixels of all of the second pixel units form multiple second sub-pixel rows arranged in the row direction. A last row of the plurality of second sub-pixel rows includes the first sub-pixel, the second sub-pixel, and the third sub-pixel.

Referring to FIG. 5, the LED display module includes a first pixel row 410, a second pixel row 420, a third pixel row 430, a fourth pixel row 440, a fifth pixel row 450 . . . and a last pixel row 460. The first pixel row 410 includes a plurality of first pixel units, such as a first first pixel unit 411, a second first pixel unit 412, and a third first pixel unit 413, that are arranged sequentially in the row direction. The first first pixel unit 411 includes the first sub-pixel 10, the second sub-pixel 20, and the third sub-pixel 30 arranged in the column direction. The second first pixel unit 412 includes the second sub-pixel 20, the third sub-pixel 30, and the first sub-pixel 10 arranged in the column direction. The third first pixel unit 413 includes the third sub-pixel 30, the first sub-pixel 10, and the second sub-pixel 20 arranged in the column direction. The sub-pixels of the first first pixel unit 411, the second first pixel unit 412, the third first pixel unit 413, and other first pixel units form a first first sub-pixel row 41, a second first sub-pixel row 42, and a third first sub-pixel row 43. The first first sub-pixel row 41 of the plurality of first sub-pixel rows includes the first sub-pixel 10, the second sub-pixel 20, and the third sub-pixel 30.

The last pixel row 460 includes multiple second pixel units, such as a first second pixel unit 461, a second second pixel unit 462, and a third second pixel unit 463, that are arranged sequentially in the row direction. The first second pixel unit 461 includes the first sub-pixel 10, the second sub-pixel 20, and the third sub-pixel 30 arranged in the column direction. The second second pixel unit 462 includes the second sub-pixel 20, the third sub-pixel 30, and the first sub-pixel 10 arranged in the column direction. The third second pixel unit 463 includes the third sub-pixel 30, the first sub-pixel 10, and the second sub-pixel 20 arranged in the column direction. The sub-pixels of the first second pixel unit 461, the second second pixel unit 462, the third second pixel unit 463, and other second pixel units form a first second sub-pixel row 44, a second second sub-pixel row 45, and a third second sub-pixel row 46 arranged in the row direction. A last row of the multiple second sub-pixel rows, namely, the third second sub-pixel row 46 includes the first sub-pixel 10, the second sub-pixel 20, and the third sub-pixel 30.

Referring to FIG. 5, sub-pixels in the first first pixel unit 411, the second first pixel unit 412, and the third first pixel unit 413 that are adjacent in the first pixel row 410 have different arrangement modes. For example, the arrangement order of sub-pixels of the first first pixel unit 411 in the column direction is the first sub-pixel 10, the second sub-pixel 20, and the third sub-pixel 30. The arrangement order of sub-pixels of the second first pixel unit 412 in the column direction is the second sub-pixel 20, the third sub-pixel 30, and the first sub-pixel 10. The arrangement order of sub-pixels of the third first pixel unit 413 in the column direction is the third sub-pixel 30, the first sub-pixel 10, and the second sub-pixel 20. In other sub-pixels of the first pixel row 410, sub-pixels in every three adjacent first pixel units in the first pixel row 410 also have different arrangement modes and are not listed herein.

Sub-pixels in the first second pixel unit 461, the second second pixel unit 462, and the third second pixel unit 463 that are adjacent in the last pixel row 460 have different arrangement modes. For example, the arrangement order of sub-pixels of the first second pixel unit 461 in the column direction is the first sub-pixel 10, the second sub-pixel 20, and the third sub-pixel 30. The arrangement order of sub-pixels of the second second pixel unit 462 in the column direction is the second sub-pixel 20, the third sub-pixel 30, and the first sub-pixel 10. The arrangement order of sub-pixels of the third second pixel unit 463 in the column direction is the third sub-pixel 30, the first sub-pixel 10, and the second sub-pixel 20. In other sub-pixels of the last pixel row 460, sub-pixels in every three adjacent first pixel units in the last pixel row 460 also have different arrangement modes and are not listed herein.

Referring to FIG. 5, the first first sub-pixel row 41 in the first pixel row 410 includes the first sub-pixel 10, the second sub-pixel 20, and the third sub-pixel 30, and a last row in at least one second sub-pixel row in the last pixel row 460, namely, the third second sub-pixel row 46 includes the first sub-pixel 10, the second sub-pixel 20, and the third sub-pixel 30. In this manner, the light emitted from pixels on the edge of the first pixel row 410 of the LED display module is derived from the sub-pixels of three colors, such as three combinations of the first sub-pixel 10, the second sub-pixel 20, and the third sub-pixel 30. Similarly, the light emitted from pixels on the edge of the last pixel row 460 of the LED display module is also derived from the sub-pixels of three colors. Therefore, when multiple LED display modules are spliced, at the splices, it can be guaranteed that light emitted from the LED pixels at each edge is from the sub-pixels of three colors, thereby ameliorating the problem that color lines of yellow light, cyan light, or pink light appear at the splicing seams.

Optionally, sub-pixels in every three adjacent first pixel units in the first pixel row have different arrangement modes, and sub-pixels in every three adjacent second pixel units in the last pixel row have different arrangement modes.

Optionally, sub-pixels in every three adjacent first pixel units in the first pixel row have different arrangement modes from sub-pixels in every three adjacent second pixel units in the last pixel row.

With such an arrangement, three different types of sub-pixels on the whole edge of the LED display module are alternately arranged so that light emitted from the whole edge is a mixture of light emitted from the three different types of sub-pixels, preventing the problem as follows: a single type of sub-pixels at one place on the edge so that color lines of yellow light, cyan light, or pink light appear at the splicing seams.

Embodiment Four

Figure 6:
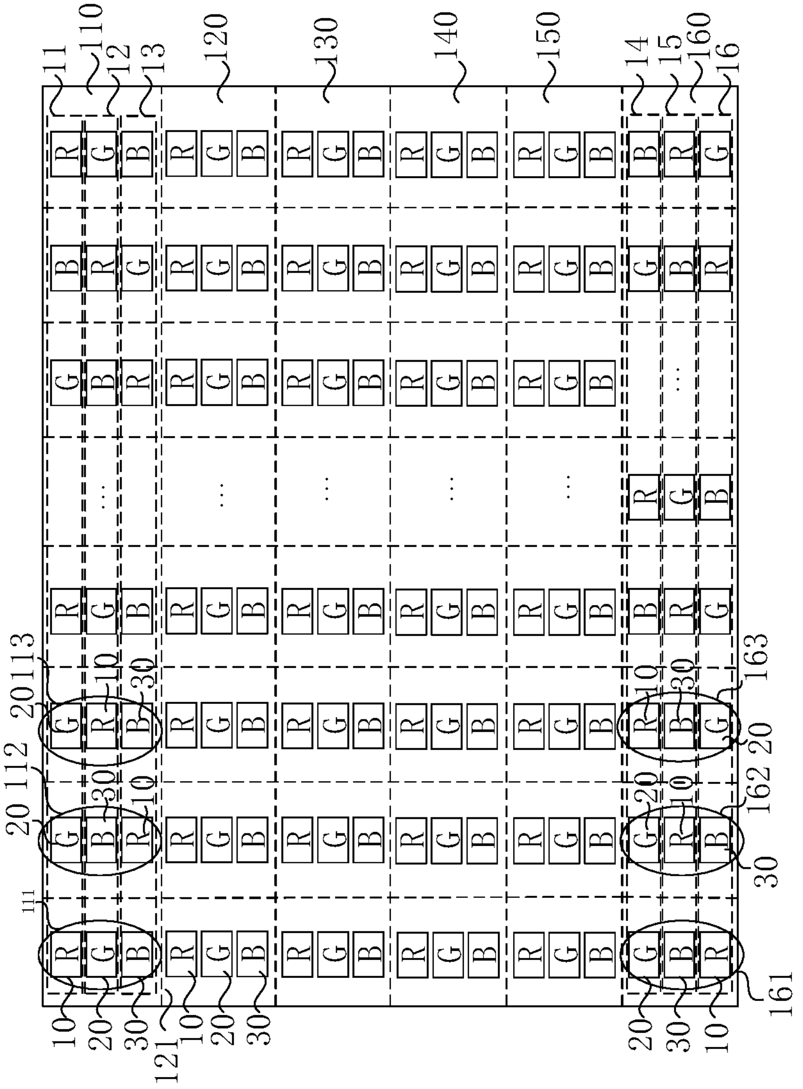
FIG. 6 is a structure illustration of an LED display module according to embodiment four of the present disclosure.

FIG. 6 is a structure illustration of an LED display module according to embodiment four of the present disclosure. On the basis of the preceding embodiments, the LED display module also includes other pixel rows in addition to the first pixel row and the last pixel row. Each of the other pixel rows includes a plurality of fourth pixel units in the row direction. Each of the plurality of fourth pixel units includes a first sub-pixel, a second sub-pixel, and a third sub-pixel arranged in the column direction.

Referring to FIG. 6, for example, the LED display module also includes the second pixel row 120, the third pixel row 130, the fourth pixel row 140, and the fifth pixel row 150 in addition to the first pixel row 110 and the last pixel row 160. The second pixel row 120, the third pixel row 130, the fourth pixel row 140, and the fifth pixel row 150 each include the plurality of fourth pixel units 121 in the row direction. The fourth pixel unit 121 includes the first sub-pixel 10, the second sub-pixel 20, and the third sub-pixel 30 arranged in the column direction.

Optionally, the first sub-pixel, the second sub-pixel, and the third sub-pixel are a red LED, a green LED, and a blue LED respectively.

The first sub-pixel 10, the second sub-pixel 20, and the third sub-pixel 30 are LEDs of different colors respectively. The first sub-pixel 10 may be any one of the red LED, the green LED, and the blue LED. Similarly, the second sub-pixel 20 may be any one of the red LED, the green LED, and the blue LED. The third sub-pixel 30 may be any one of the red LED, the green LED, and the blue LED. For example, the first sub-pixel 10, the second sub-pixel 20, and the third sub-pixel 30 may also be the blue LED, the red LED, and the green LED respectively. The first sub-pixel 10, the second sub-pixel 20, and the third sub-pixel 30 may also be LEDs of other colors other than the red LED, the green LED, and the blue LED.

Embodiment Five

Figure 7:
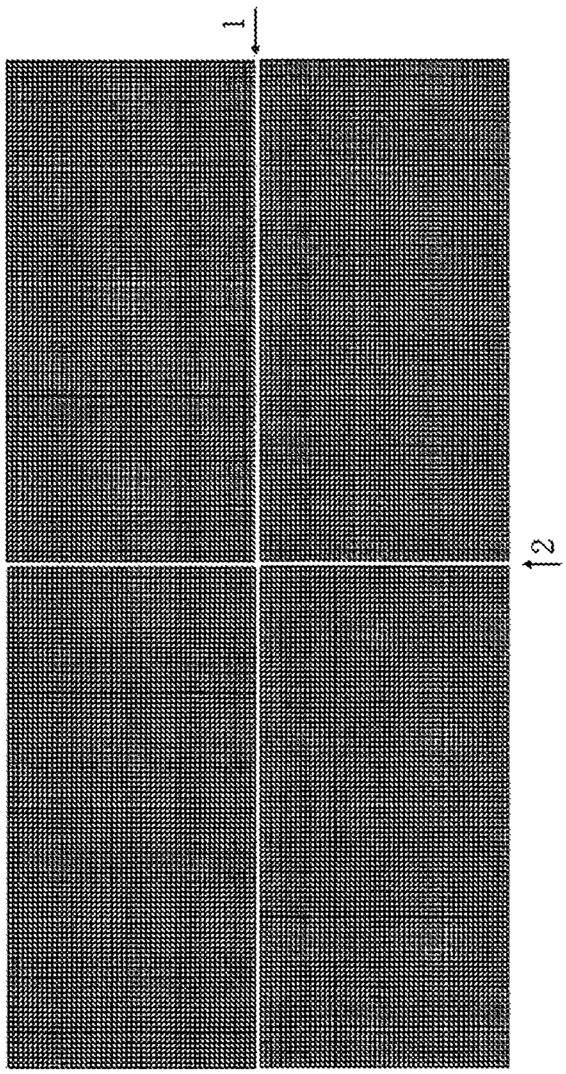
FIG. 7 is a structure illustration of an LED display device according to embodiment five of the present disclosure.

FIG. 7 is a structure illustration of an LED display device according to embodiment five of the present disclosure. Referring to FIG. 7, the LED display device includes multiple LED display modules described in any one of embodiments of the present disclosure and arranged in an array.

Referring to FIG. 7, the LED display device is a large display module formed by splicing the plurality of LED display modules. The splicing seam 1 and the splicing seam 2 shown in FIG. 7 are formed when the plurality of LED display modules are spliced. When the LED display device is formed by splicing the plurality of LED display modules, a first row in at least one first sub-pixel row in a first pixel row of the LED display module, namely, a first sub-pixel row includes at least two types of a first sub-pixel, a second sub-pixel, and a third sub-pixel. A last row in at least one second sub-pixel row in a last pixel row, namely, a second sub-pixel row includes at least two types of the first sub-pixel, the second sub-pixel, and the third sub-pixel. In this manner, the light emitted from pixels on the edge of the first pixel row of the LED display module is derived from the sub-pixels of at least two colors, such as a combination of at least two types of the first sub-pixel, the second sub-pixel, and the third sub-pixel. Similarly, the light emitted from pixels on the edge of the last pixel row of the LED display module is also derived from the sub-pixels of at least two colors. Therefore, when the plurality of LED display modules are spliced, at the splices, it can be guaranteed that light emitted from the LED pixels at each edge is from the sub-pixels of at least two colors among the three colors, thereby ameliorating the problem that color lines of yellow light, cyan light, or pink light appear at the splicing seams.

What is claimed is:

1. A LED display device, comprising: a plurality of LED display modules, wherein the plurality of LED display modules are arranged in an array, wherein each of the plurality of LED display modules comprises a plurality of pixel rows, wherein a first pixel row of the plurality of pixel rows comprises a plurality of first pixel units arranged sequentially in a row direction, each of the plurality of first pixel units comprises a first sub-pixel, a second sub-pixel, and a third sub-pixel, and sub-pixels of the plurality of first pixel units form at least one first sub-pixel row arranged in the row direction, wherein a first row of the at least one first sub-pixel row comprises at least two types of the first sub-pixel, the second sub-pixel, and the third sub-pixel; and a last pixel row of the plurality of pixel rows comprises a plurality of second pixel units arranged sequentially in the row direction, each of the plurality of second pixel units comprises a first sub-pixel, a second sub-pixel, and a third sub-pixel, and sub-pixels of the plurality of second pixel units form at least one second sub-pixel row arranged in the row direction, wherein a last row of the at least one second sub-pixel row comprises at least two types of the first sub-pixel, the second sub-pixel, and the third sub-pixel, and wherein the each of the plurality of first pixel units comprises the first sub-pixel, the second sub-pixel, and the third sub-pixel arranged in the row direction, and the sub-pixels of the plurality of first pixel units form one first sub-pixel row arranged in the row direction; and the each of the plurality of second pixel units comprises the first sub-pixel, the second sub-pixel, and the third sub-pixel arranged in the row direction, and the sub-pixels of the plurality of second pixel units form one second sub-pixel row arranged in the row direction.

2. The LED display device according to claim 1, wherein at least one of the first pixel row or the last pixel row further comprises third pixel units, wherein the third pixel units are respectively located at two ends of a pixel row in which the third pixel units are located, and each of the third pixel units comprises a first sub-pixel, a second sub-pixel, and a third sub-pixel, wherein the first sub-pixel, the second sub-pixel, and the third sub-pixel are arranged in a column direction.

3. The LED display device according to claim 1, wherein the first sub-pixel, the second sub-pixel, and the third sub-pixel are a red LED, a green LED and a blue LED respectively.

4. A LED display device, comprising: a plurality of LED display modules, wherein the plurality of LED display modules are arranged in an array, wherein each of the plurality of LED display modules comprises a plurality of pixel rows, wherein a first pixel row of the plurality of pixel rows comprises a plurality of first pixel units arranged sequentially in a row direction, each of the plurality of first pixel units comprises a first sub-pixel, a second sub-pixel, and a third sub-pixel, and sub-pixels of the plurality of first pixel units form at least one first sub-pixel row arranged in the row direction, wherein a first row of the at least one first sub-pixel row comprises at least two types of the first sub-pixel, the second sub-pixel, and the third sub-pixel; and a last pixel row of the plurality of pixel rows comprises a plurality of second pixel units arranged sequentially in the row direction, each of the plurality of second pixel units comprises a first sub-pixel, a second sub-pixel, and a third sub-pixel, and sub-pixels of the plurality of second pixel units form at least one second sub-pixel row arranged in the row direction, wherein a last row of the at least one second sub-pixel row comprises at least two types of the first sub-pixel, the second sub-pixel, and the third sub-pixel, and wherein the each of the plurality of first pixel units comprises the first sub-pixel, the second sub-pixel, and the third sub-pixel arranged in a column direction, and the sub-pixels of the plurality of first pixel units form a plurality of first sub-pixel rows arranged in the row direction, wherein a first row of the plurality of first sub-pixel rows comprises at least two types of the first sub-pixel, the second sub-pixel, and the third sub-pixel; and the each of the plurality of second pixel units comprises the first sub-pixel, the second sub-pixel, and the third sub-pixel arranged in the column direction, and the sub-pixels of the plurality of second pixel units form a plurality of second sub-pixel rows arranged in the row direction, wherein a last row of the plurality of second sub-pixel rows comprises at least two types of the first sub-pixel, the second sub-pixel, and the third sub-pixel.

5. The LED display device according to claim 4, wherein adjacent ones of sub-pixels in the first row of the plurality of first sub-pixel rows are configured to emit light of different colors, and adjacent ones of sub-pixels in the last row of the plurality of second sub-pixel rows are configured to emit light of different colors.

6. The LED display device according to claim 4, wherein the first row of the plurality of first sub-pixel rows comprises the first sub-pixel, the second sub-pixel, and the third sub-pixel; and the last row of the plurality of second sub-pixel rows comprises the first sub-pixel, the second sub-pixel, and the third sub-pixel.

7. The LED display device according to claim 6, wherein sub-pixels in every three adjacent first pixel units in the first pixel row have different arrangement modes; and sub-pixels in every three adjacent second pixel units in the last pixel row have different arrangement modes.

8. A LED display device, comprising: a plurality of LED display modules, wherein the plurality of LED display modules are arranged in an array, wherein each of the plurality of LED display modules comprises a plurality of pixel rows, wherein a first pixel row of the plurality of pixel rows comprises a plurality of first pixel units arranged sequentially in a row direction, each of the plurality of first pixel units comprises a first sub-pixel, a second sub-pixel, and a third sub-pixel, and sub-pixels of the plurality of first pixel units form at least one first sub-pixel row arranged in the row direction, wherein a first row of the at least one first sub-pixel row comprises at least two types of the first sub-pixel, the second sub-pixel, and the third sub-pixel; and a last pixel row of the plurality of pixel rows comprises a plurality of second pixel units arranged sequentially in the row direction, each of the plurality of second pixel units comprises a first sub-pixel, a second sub-pixel, and a third sub-pixel, and sub-pixels of the plurality of second pixel units form at least one second sub-pixel row arranged in the row direction, wherein a last row of the at least one second sub-pixel row comprises at least two types of the first sub-pixel, the second sub-pixel, and the third sub-pixel, and further comprising other pixel rows in addition to the first pixel row and the last pixel row, each of the other pixel rows comprises a plurality of fourth pixel units arranged sequentially in the row direction, and each of the plurality of fourth pixel units comprises a first sub-pixel, a second sub-pixel, and a third sub-pixel arranged in a column direction.

* * * * *